(12) United States Patent
Lin

(10) Patent No.: US 6,296,974 B1
(45) Date of Patent: Oct. 2, 2001

(54) METHOD OF FORMING A MULTI-LAYER PHOTO MASK

(76) Inventor: Benjamin Szu-Min Lin, 3F, No. 165, Lane 89, Sec. 1, Kuang-Fu Rd., Hsin-Chu City (TW)

( * ) Notice: Subject to any disclaimer, the term of this patent is extended or adjusted under 35 U.S.C. 154(b) by 0 days.

(21) Appl. No.: 09/391,321

(22) Filed: Sep. 8, 1999

(51) Int. Cl.$^7$ ........................................................ G03P 9/00
(52) U.S. Cl. ........................................................ 430/5
(58) Field of Search ................................ 430/5, 322, 323, 430/324

(56) References Cited

U.S. PATENT DOCUMENTS

| | | | |
|---|---|---|---|
| 5,536,606 | * | 7/1996 | Doan ........................................ 430/5 |
| 5,698,349 | * | 12/1997 | Yang ........................................ 430/5 |
| 6,071,653 | * | 6/2000 | Lin ............................................ 430/5 |

* cited by examiner

Primary Examiner—S. Rosasco

(57) ABSTRACT

This invention provides a method of forming a multi-layer photo mask on a photo mask substrate. A first transparent layer comprising at least one vertical side wall is formed on at least one predetermined area of the photo mask substrate. A first opaque spacer is formed around the vertical side wall of the first transparent layer, and the top side of the first spacer is approximately leveled off with the upper surface of the first transparent layer. An external transparent layer is formed on the photo mask substrate and outside the predetermined area, and the upper surface of the external transparent layer is leveled off with that of the first transparent layer. So the first transparent layer and the external transparent layer form a first photo mask layer. A second transparent layer comprising at least one vertical side wall is formed on at least one predetermined area of the first photo mask layer. A second opaque spacer is formed around the vertical side wall of the second transparent layer, and the top side of the second spacer is approximately leveled off with the upper surface of the second transparent layer.

9 Claims, 6 Drawing Sheets

METHOD OF FORMING A MULTI-LAYER PHOTO MASK

BACKGROUND OF THE INVENTION

1. Field of the Invention

The present invention relates to a method of forming a photo mask, and more particularly, to a method of forming a multi-layer photo mask.

2. Description of the Prior Art

In semiconductor processing, a designed pattern is initially formed on a photo mask and then the pattern of the photo mask is transferred onto the surface of a semiconductor wafer by a photolithography process so as to define the pattern of integrated circuits. The photo mask with poor quality is not in favor of the pattern transfer which may result in the poor electrical performance of semiconductor products and the high cost of processing. Therefore, how to form a photo mask with good quality becomes a very important issue.

Please refer to FIG. 1 to FIG. 4. FIG. 1 to FIG. 4 are schematic diagrams of a method of forming a phase-shift photo mask 26 according to the prior art. A method of forming a phase-shift photo mask is performed on a photo mask substrate 10 made of quartz. The photo mask substrate 10 is defined by a plurality of predetermined regions 20 according to a designed pattern required by a semiconductor process. During the method of forming the phase-shift photo mask 26, an anti-reflective layer 12, a phase shifter 14, a first opaque layer 16 made of chromium (Cr), and a first photoresist layer 18 are formed in sequence, as shown in FIG. 1. The anti-reflective layer 12 is used for enhancing the light transmission rate of the photo mask substrate 10. The phase-shift layer 14 is used for driving the transmitting light to generate a phase-shift angle for about 180°.

Next, an exposure process is performed by using laser beam or electronical beam (E-beam) to expose the first photoresist layer 18. Then a development process is performed to form a second photoresist layer 19 on the predetermined region 20 of the photo mask substrate 10, as shown in FIG. 2. Afterward, an etching process is performed to vertically remove the first opaque layer 16 outside the predetermined region 20 so as to form a second opaque layer 17 where the designed pattern is defined, as shown in FIG. 3. Finally, a resist stripping process is performed to completely remove the second photoresist layer 19 so that the phase-shift photo mask 26 is completed, as shown in FIG. 4

According to the prior art method of forming the phase-shift photo mask 26, the designed pattern is defined on the second opaque layer 17 wherein a line width W and a line space S form a minimum pitch 25. The minimum line width and the minimum line space of the pattern on the phase-shift photo mask 26 are both limited, because of a certain resolution of laser beam or E-beam. Therefore, there will be a limitation in the minimum pitch 25 of the phase-shift photo mask 26. Since the line width of the pattern is related to the pitch 25 of the phase-shift photo mask 26, the phase-shift photo mask 26 with the minimum pitch 25 may not be applied to a semiconductor process with a narrower width. Although the minimum pitch 25 could be further reduced by changing the light source used in the exposure process and the material of the first photoresist layer 18, this will greatly increase the process cost and hence not meet the economic efficiency.

SUMMARY OF THE INVENTION

It is therefore a primary objective of the present invention to provide a method of forming a multi-layer photo mask, which can not only form a pattern of narrower width but also define various minimum pitches to be employed in a semiconductor process with a narrower width.

In a preferred embodiment, the present invention provides a method of forming a multi-layer photo mask on a photo mask substrate comprising:

forming a first transparent layer on at least one predetermined area of the photo mask substrate, the first transparent layer comprising at least one vertical side wall;

forming a first opaque spacer around the vertical side wall of the first transparent layer, the top side of the first spacer being approximately leveled off with the upper surface of the first transparent layer;

forming an external transparent layer on the photo mask substrate and outside the predetermined area, the upper surface of the external transparent layer being leveled off with that of the first transparent layer and the first transparent layer and the external transparent layer forming a first photo mask layer;

forming a second transparent layer on at least one predetermined area of the first photo mask layer the second transparent layer comprising at least one vertical side wall; and forming a second opaque spacer around the vertical side wall of the second transparent layer, the top side of the second spacer approximately being leveled off with the upper surface of the second transparent layer.

It is an advantage of the present invention that the method of forming the multi-layer photo mask can define narrower pitches by adjusting the space between the first opaque spacer and the second opaque spacer. So the method can be employed in a semiconductor process with a narrower width.

This and other objective of the present invention will no doubt become obvious to those of ordinary skill in the art after having read the following detailed description of the preferred embodiment which is illustrated in the various figures and drawings.

DETAILED DESCRIPTION OF THE PREFERRED EMBODIMENT

Figure 1:
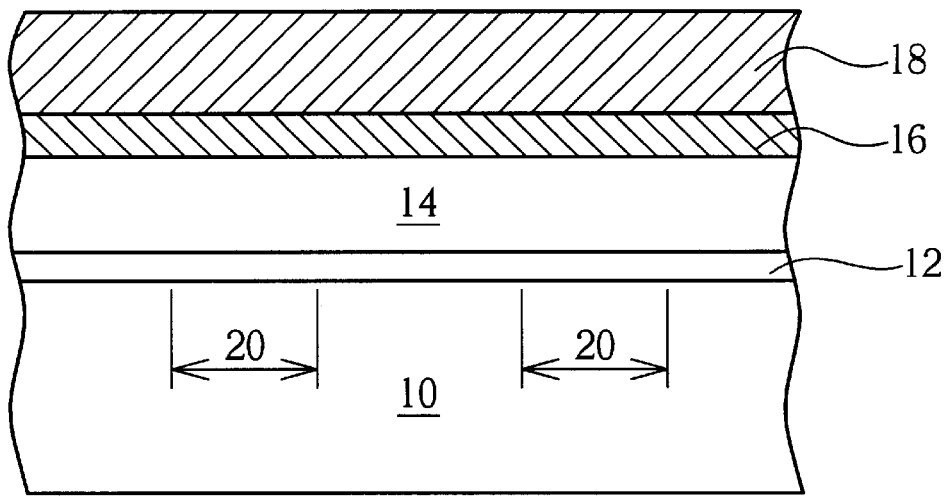
FIG. 1 to FIG. 4 are schematic diagrams of a method of forming a phase-shift photo mask according to the prior art.
Figure 2:
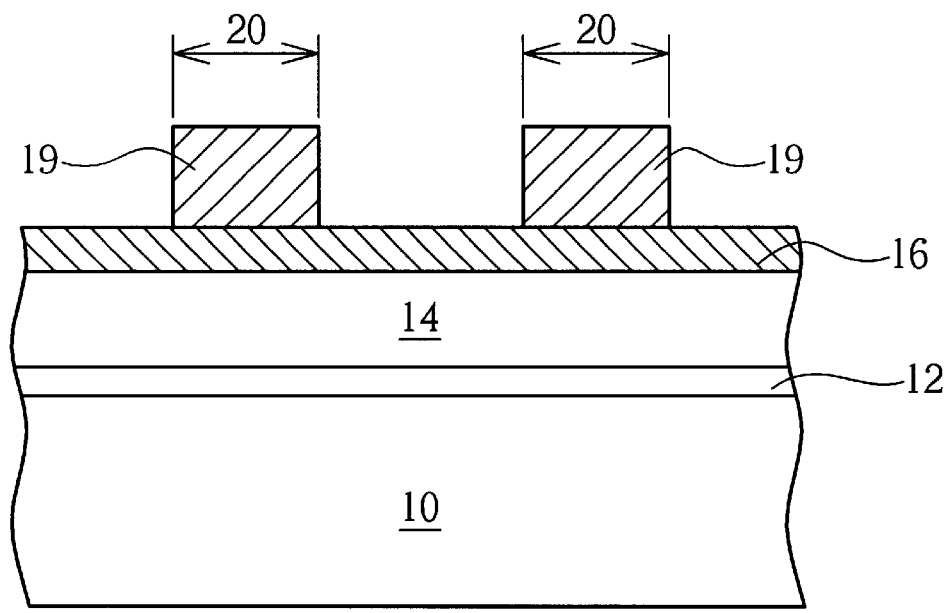
Figure 3:
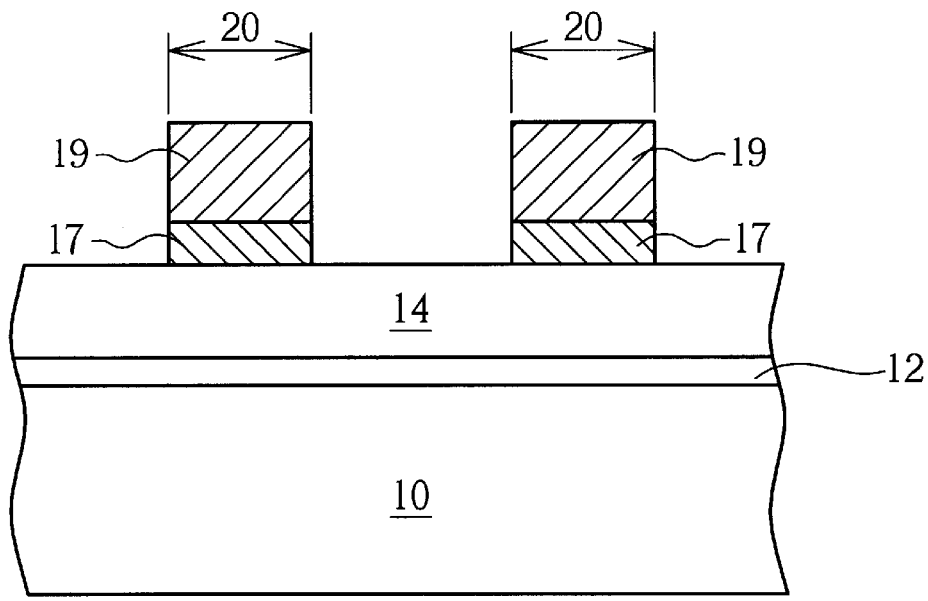
Figure 4:
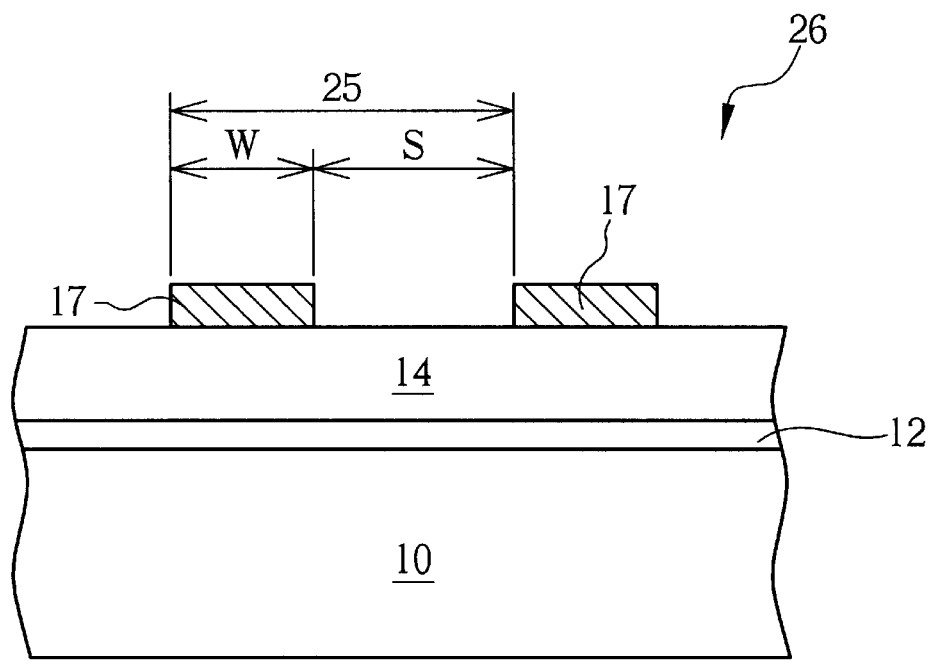
Figure 5:
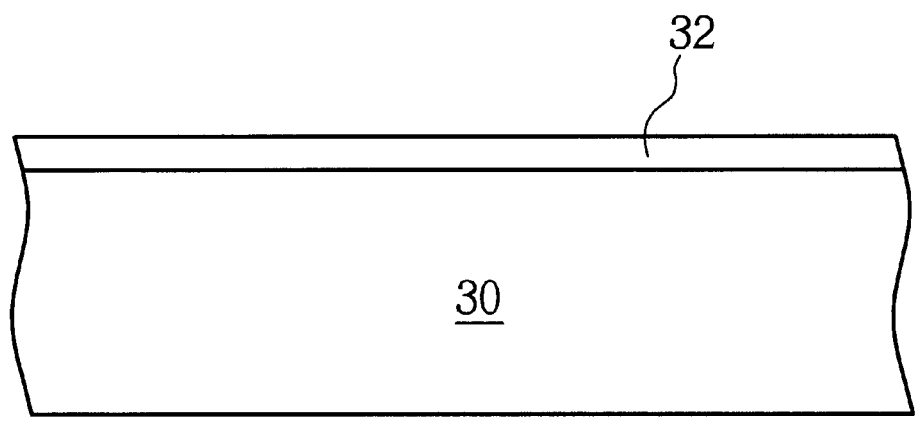
FIG. 5 to FIG. 12 are schematic diagrams of a method of forming a multi-layer photo mask according to the present invention.
Figure 6:
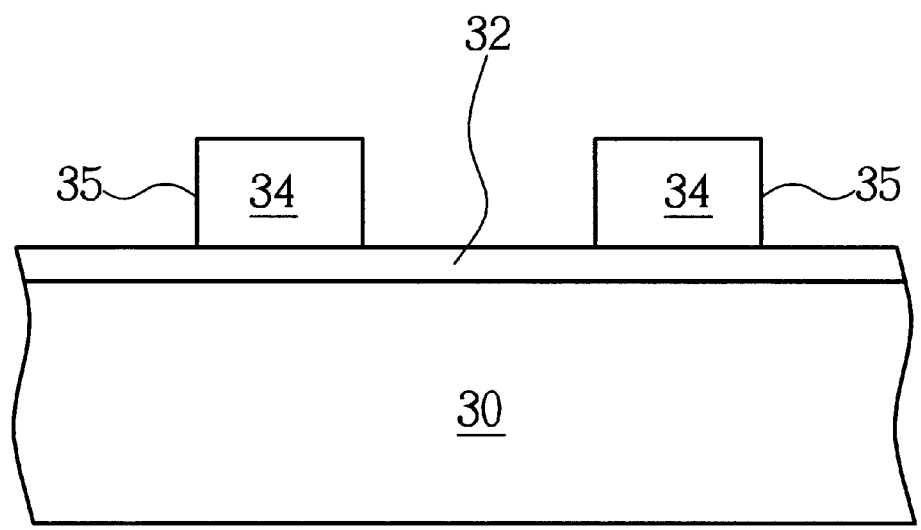

Please refer to FIG. 5 to FIG. 12. FIG. 5 to FIG. 12 are schematic diagrams of a method of forming a multi-layer photo mask 50 according to the present invention. A method of forming a multi-layer photo mask 50 is performed on a photo mask substrate 30 made of quartz. The photo mask substrate 30 comprises an anti-reflective layer 32 of uniform thickness for enhancing the light transmission rate of the photo mask substrate 30, as shown in FIG. 5. In the method of forming the multi-layer photo mask 50, a first transparent layer 34 comprising at least one vertical side wall 35 is formed on at least one predetermined area of the photo mask substrate 30, as shown in FIG. 6. The first transparent layer 34 is made of $SiO_2$ or $Si_3N_4$ by performing the plasma-enhanced chemical vapor deposition (PECVD) process, the photolithography process and the etching process.

Figure 7:
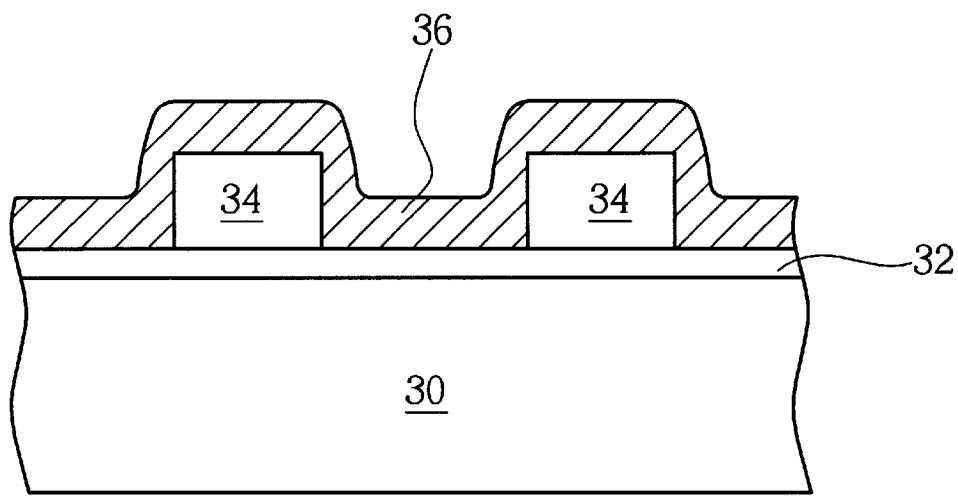
Figure 8:
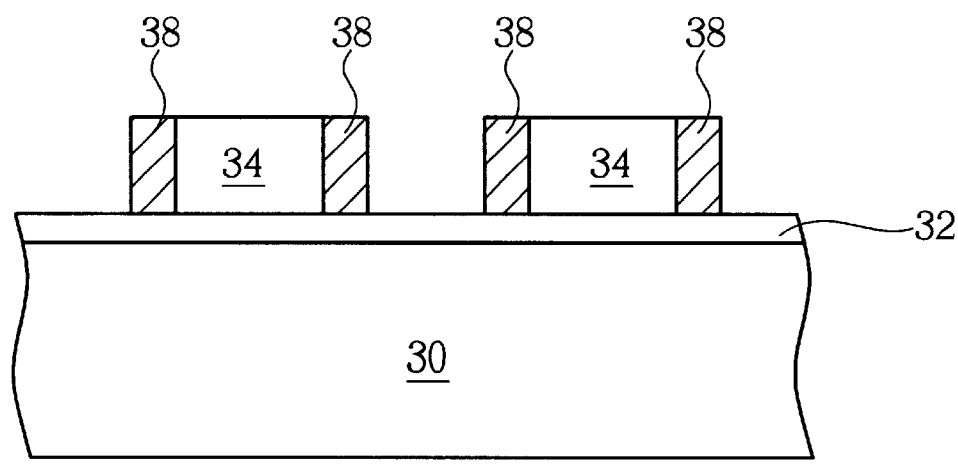

Next, a first opaque layer 36 of uniform thickness made of chromium (Cr) is formed on the surface of the first transparent layer 34 and the surface of the photo mask substrate 30 not covered by the first transparent layer 34, as shown in FIG. 7. Then, an anisotropic etching process is performed to remove the first opaque layer 36 positioned on the upper surface of the first transparent layer 34 and on the surface of the photo mask substrate 30. Therefore, the remaining first opaque layer 36 around the vertical side wall 35 of the first transparent layer 34 forms a first opaque spacer 38. Also, the top side of the first opaque spacer 38 is approximately leveled off with the upper surface of the first transparent layer 34, as shown in FIG. 8.

Figure 9:
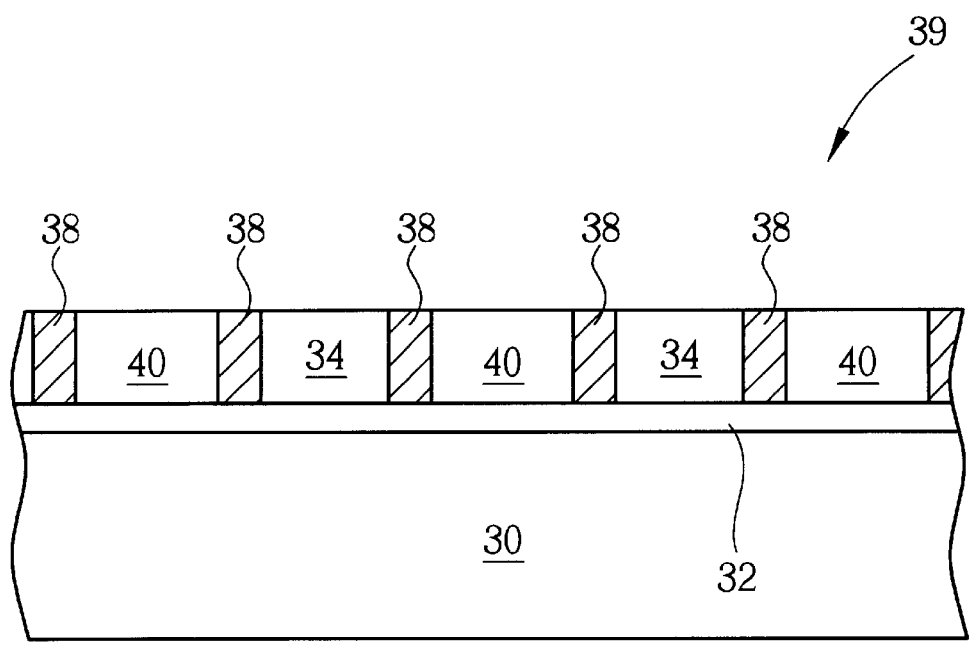

Next, an external transparent layer 40 made of $SiO_2$ or $Si_3N_4$ is formed on the surface of the first transparent layer 34 and the surface of the photo mask substrate 30 not covered by the first transparent layer 34 by means of spin-coating. Then, a chemical mechanical polishing (CMP) process is performed to uniformly remove the upper portion of the external transparent layer 40 down to the upper surface of the first transparent layer 34, as shown in FIG. 9. As a result, the first transparent layer 34 and the external transparent layer 40 forms a first photo mask layer 39.

Figure 10:
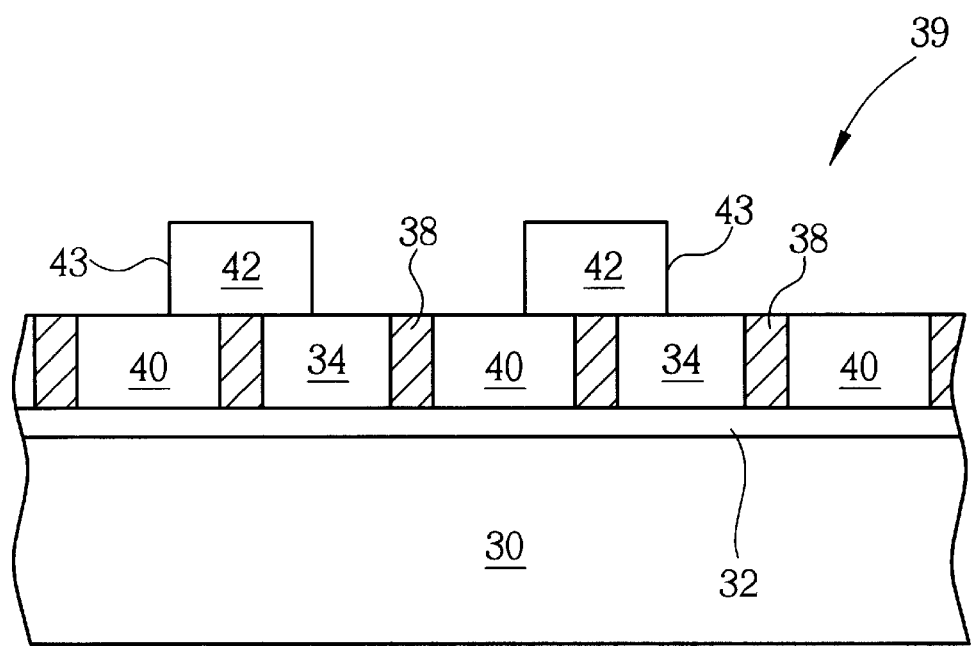
Figure 11:
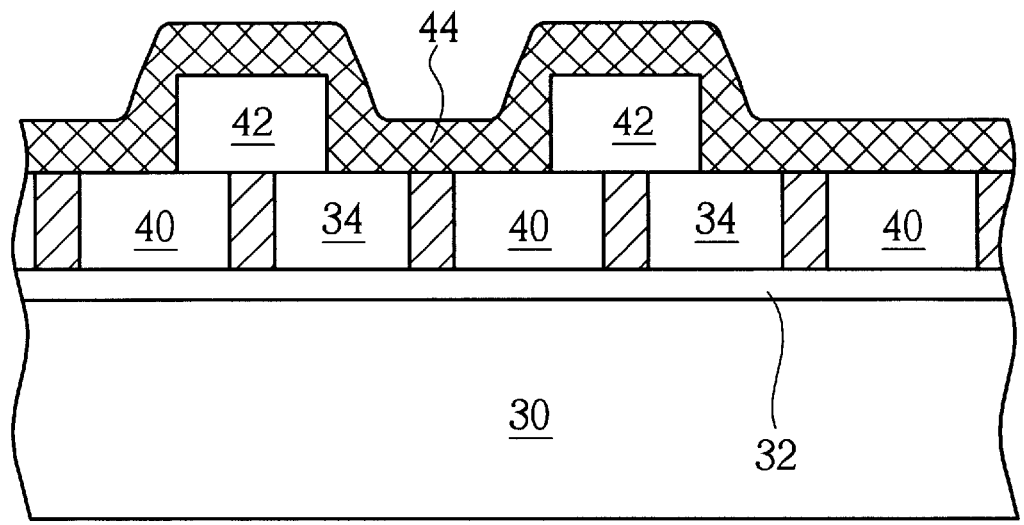
Figure 12:
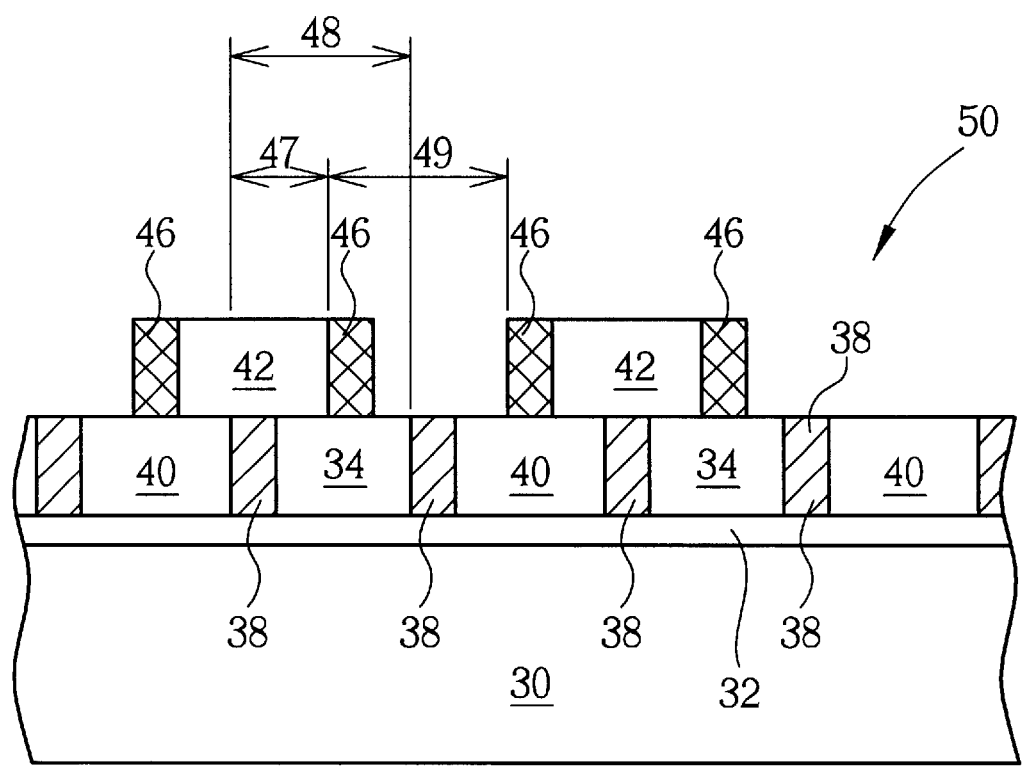

Afterward, a second transparent layer 42 comprising at least one vertical side wall 43 is formed on at least one predetermined area of the first photo mask layer 39, as shown in FIG. 10. The second transparent layer 42 can be formed by performing the PECVD process, the photolithography process and the etching process. Next, a second opaque layer 44 made of chromium (Cr) is formed on the surface of the second transparent layer 42 and the surface of the first photo mask layer 39 not covered by the second transparent layer 42, as shown in FIG. 11. Finally, an anisotropic etching process is performed to remove the second opaque layer 44 positioned on the upper surface of the second transparent layer 42 and the surface of the first photo mask layer 39. Therefore, the remaining second opaque layer 44 around the vertical side wall 43 of the second transparent layer 42 forms a second opaque spacer 46. Also, the top side of the second opaque spacer 46 is approximately leveled off with the upper surface of the second transparent layer 42 so as to complete the multi-layer photo mask 50, as shown in FIG. 12.

The first transparent layer 34, the second transparent layer 42 and the external transparent layer 40 are made of $SiO_x$、$MoSiON$、$SiN_x$、atypical carbon or CrF. The first opaque layer 36 and the second opaque layer 44 are made of chromium、aluminum or MoSi. Thus, the first and the second opaque spacers 38 and 46 can be formed after etching the first and the second opaque layer 36 and 44, respectively.

The first opaque spacer 38 around the first transparent layer 34 and the second opaque spacer 46 around the second transparent layer 42 positioned below the first transparent layer 34 are used to form the lines of the pattern and define various pitches. The width of the first opaque spacer 38 and the space between the first opaque spacer 38 and the adjacent second opaque spacer 46 form a first pitch 47. The width of the first opaque spacer 38 and the space between the first opaque spacer 38 and the adjacent first opaque spacer 38 form a second pitch 48. The width of the second opaque spacer 46 and the space between the second opaque spacer 46 and the adjacent second opaque spacer 46 form a third pitch 49.

The first opaque spacer 38 and the second opaque spacer 46 of the multi-layer photo mask 50 are used to define the lines of the pattern. It is different from the prior method in which the photoresist layer of the phase-shift photo mask 26 is used to define the lines of the pattern. The line width of the multi-layer photo mask 50 can be controlled within a range of hundreds of angstrom (A). Also, the first opaque spacer 38 and the second opaque spacer 46 can be used to define the first, second and third pitches 47,48 and 49. Adjusting the position of the first transparent layer 34 and the second transparent layer 42 can change the space between the first opaque spacer 38 and the second opaque spacer 46 so as to properly manipulate the pitch to meet the requirement of the pattern. Hence, the method can be employed in a semiconductor process with a narrower width.

Compared to the prior method of forming the phase-shift photo mask 26, in the method of forming the multi-layer photo mask 50 of the present invention, the first pitch 47, the second pitch 48 and the third pitch 49 are defined by the first opaque spacer 38 positioned around the vertical side wall 35 of the first transparent layer 34 and the second opaque spacer 46 positioned around the vertical side wall 43 of the second transparent layer 42. Therefore, the method can define narrower pitches of the pattern and hence be employed in a semiconductor process with a narrower width.

Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A method of forming a multi-layer photo mask on a photo mask substrate comprising:

forming a first transparent layer on at least one predetermined area of the photo mask substrate, the first transparent layer comprising at least one vertical side wall;

forming a first opaque spacer around the vertical side wall of the first transparent layer, the top side of the first spacer being approximately leveled off with the upper surface of the first transparent layer;

forming an external transparent layer on the photo mask substrate and outside the predetermined area, the upper surface of the external transparent layer being leveled off with that of the first transparent layer and the first transparent layer and the external transparent layer forming a first photo mask layer;

forming a second transparent layer on at least one predetermined area of the first photo mask layer, the second transparent layer comprising at least one vertical side wall; and forming a second opaque spacer around the vertical side wall of the second transparent layer, the top side of the second spacer approximately being leveled off with the upper surface of the second transparent layer.

2. The method of claim 1 wherein the photo mask substrate further comprises an anti-reflective layer of uniform thickness for enhancing the light transmission rate of the photo mask substrate.

3. The method of claim 1 wherein the photo mask substrate is made of quartz.

4. The method of claim 1 wherein the method of forming the first opaque spacer comprises:

forming a first opaque layer of uniform thickness on the surface of the first transparent layer and the surface of the photo mask substrate not covered by the first transparent layer; and performing an anisotropic etching process to remove the first opaque layer positioned on the upper surface of the first transparent layer and on the surface of the photo mask substrate wherein the remaining first opaque layer around the vertical side wall of the first transparent layer will form the first opaque spacer after the anisotropic etching process.

5. The method of claim 1 wherein the method of forming the external transparent layer comprises:

forming the external transparent layer on the surface of the first transparent layer and on the surface of the photo mask substrate not covered by the first transparent layer; and performing a chemical mechanical polishing (CMP) process to uniformly remove the upper portion of the external transparent layer down to the upper surface of the first transparent layer.

6. The method of claim 5 wherein the external transparent layer is formed on the surface of the first transparent layer and the surface of the photo mask substrate not covered by the first transparent layer by means of spin-coating.

7. The method of claim 1 wherein the method of forming the second opaque spacer comprises:

forming a second opaque layer on the surface of the second transparent layer and the surface of the first photo mask layer not covered by the second transparent layer; and performing an isotropic etching process to remove the second opaque layer positioned on the upper surface of the second transparent layer and the surface of the first photo mask layer wherein the remaining second opaque layer around the vertical side wall of the second transparent layer will form the second opaque spacer after the anisotropic etching process.

8. The method of claim 1 wherein the first and second opaque spacers are made of chromium (Cr) 、aluminum (Al) or MoSi.

9. The method of claim 1 wherein the first and second transparent layers are both made of $SiO_x$ 、MoSiON 、$SiN_x$ 、atypical carbon or CrF.

* * * * *